(12) United States Patent
Liaw

(10) Patent No.: US 6,649,456 B1
(45) Date of Patent: Nov. 18, 2003

(54) SRAM CELL DESIGN FOR SOFT ERROR RATE IMMUNITY

(75) Inventor: Jhon-Jhy Liaw, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/272,081

(22) Filed: Oct. 16, 2002

(51) Int. Cl.[7] .................. H01L 21/00; H01L 21/336
(52) U.S. Cl. .................. 438/153; 438/154; 438/260; 438/264; 438/266
(58) Field of Search .................. 438/153, 154, 438/163, 200, 217, 260, 264, 266, 265; 257/368, 369, 377, 393, 390, 903

(56) References Cited

U.S. PATENT DOCUMENTS

| | | | | | |
|---|---|---|---|---|---|
| 5,293,349 A | * | 3/1994 | Hollander et al. | ...... | 365/230.05 |
| 5,375,086 A | * | 12/1994 | Wahlstrom | ............. | 365/149 |
| 5,496,756 A | * | 3/1996 | Sharma et al. | ............. | 438/258 |
| 5,547,892 A | * | 8/1996 | Wuu et al. | ............. | 438/152 |
| 5,677,867 A | * | 10/1997 | Hazani | ............. | 365/185.01 |
| 5,949,706 A | * | 9/1999 | Chang et al. | ............. | 365/156 |
| 6,054,742 A | * | 4/2000 | Gonzalez | ............. | 257/392 |
| 6,136,652 A | * | 10/2000 | Hazani | ............. | 438/260 |
| 6,140,684 A | * | 10/2000 | Chan et al. | ............. | 257/368 |
| 6,157,558 A | * | 12/2000 | Wong | ............. | 365/49 |
| 6,271,063 B1 | * | 8/2001 | Chan et al. | ............. | 438/153 |
| 6,421,265 B1 | * | 7/2002 | Lien et al. | ............. | 365/49 |
| 6,510,076 B1 | * | 1/2003 | Lapadat et al. | ............. | 365/154 |

* cited by examiner

Primary Examiner—Michael S. Lebentritt
(74) Attorney, Agent, or Firm—George O. Saile; Stephen B. Ackerman; Douglas R. Schnabel

(57) ABSTRACT

A new method to form a SRAM memory cell in an integrated circuit device is achieved. The method comprises providing a bi-stable flip-flop cell having a data storage node and a data bar storage node. A first capacitor is formed coupled to the data bar storage node, and a second capacitor is formed coupled to the data storage node. The first and second capacitors comprise a first conductor layer overlying a second conductor layer with a dielectric layer therebetween. One of the first and second conductor layers is coupled to ground. A new SRAM device is disclosed.

13 Claims, 5 Drawing Sheets

SRAM CELL DESIGN FOR SOFT ERROR RATE IMMUNITY

BACKGROUND OF THE INVENTION (1) Field of the Invention

The invention relates to SRAM memory cells and, more particularly, to a method to improve soft error rate immunity in a SRAM cell through the novel addition of storage capacitance.

(2) Description of the Prior Art

Static RAM, or SRAM, devices are used in many electronic design applications. SRAM devices provide read/write capability with relatively low current consumption compared to dynamic RAM (DRAM). In deep submicron technology, the SRAM is very popular due to its advantages of high speed and lower power consumption. Therefore, SRAM is frequently used in communications and system on chip (SOC) products.

Design approaches to further reduce SRAM cell size and power consumption and to improve thermal stability have been ongoing in the art. This is particularly true due to the increasing size of SRAM arrays on integrated circuit devices. To achieve smaller cell size and to reduce power consumption, designers have developed SRAM devices that operate on reduced voltage supplies.

Referring now to FIG. 1, a conventional SRAM memory cell 10 is illustrated. This SRAM cell 10 comprises six transistors and is called a 6T cell. The 6T cell comprises a bi-stable flip-flop that, in turn, comprises transistors PU1 34, PD1 38, PU2 42, and PD2 46. In this arrangement, a first inverter is formed by the first pull-up PU1 34 and the first pull-down PD1 38. A second inverter is formed by the second pull-up PU2 42 and the second pull-down PD2 46. Note that the inverters are chained together, input to output, to form storage nodes ST1 58 and ST2 62. This is called a bi-stable flip-flop because the inverters can maintain either of two, stable conditions. In the first condition, ST1 58 is low (VSS) and ST2 62 is high (VCC). In the second condition, ST1 58 is high and ST2 62 is low. The feedback of each inverter output to the other inverter input makes the flip-flop stable in either state once the state is initialized.

Access transistors PG1 50 and PG2 54 provide a means to read or write data to the flip-flop. The access transistors PG1 50 and PG2 54 are controlled by word line signals WL 30. It is common for the SRAM cells 10 to be arrayed in columns and rows. and for a row of cells to be commonly selected using a single word line WL 30 signal. The bit line BL 26 and bit line bar BLB 22 signals are used for reading or writing the cell 10. For example, during a write operation, the BL signal is forced to the desired write data state while the BLB signal is forced to the opposite state. When WL is then asserted, the new state (BL) is forced into the cell. When WL is then de-asserted, the cell 10 will maintain the new state on the storage node ST1 58 and the bar state on storage node ST2 62.

A significant measure of SRAM cell performance is the ability of the cell 10 to maintain the data state in the presence of various types of noise and soft error factors. For example, the cell 10 must maintain a written state in the presence of noise on the VCC 14 line.

The above-described work to reduce the cell 10 size typically means that the individual transistors are made smaller. As is typical in the art, this also may mean that the gate oxides are made thinner and the source/drain junctions are made shallower. These approaches allow the formation of smaller and faster switching transistors. However, such design changes also require that supply voltage VCC 14 be reduced to insure the reliability of these devices. As discussed above, the reduction of the supply voltage VCC 14 can have a positive additional effect of reducing the power consumption of the SRAM device given by $P=I \times V$.

While the above-described changes can be good for the SRAM performance, they are not derived without cost. In particular, the reduction in power supply VCC 14 voltage can make the resulting SRAM cell 10 more susceptible to soft error rate effects. Soft error rate is a measure of the ability of the cell 10 to maintain a data state in the presence of environmental noise such as alpha ($\alpha$) particles. Alpha particles are a form of radiation energy commonly found in the environment. Alpha particles are very high energy particles that are very capable of penetrating many objects in the environment.

Referring now to FIG. 2, a cross section of a part of a typical SRAM cell is shown. The cross section illustrates a common source 74 between two transistors 90 and 82. In this case, the transistors are n-channel devices formed in a p-well 70. An alpha particle 98 strikes the integrated circuit. In the p-well region 70, the energy of the particle passing through causes the generation of charge carriers. The negative charge is attracted to the neighboring n-well region 72 while positive charge is attracted to the common source 94.

It is important to note that charge storage on nodes ST1 and ST2 of the 6T SRAM cell is governed by the equation $Q=C \times V$, where Q is the charged stored, C is the capacitance of the storage node, and V is the voltage of the node. As the power supply voltage VCC is reduced, the stored charge on the storage nodes ST1 and ST2 is reduced proportionally. If the charge generated by alpha particle penetration ($Q_\alpha$) exceeds the charge stored ($Q_{ST}$), then the bi-stable flip-flop may flip states and generate a bit error. In addition, the charge on ST1 and the charge on ST2 are shared onto the BLB and BL buses, respectively, during a READ operation. If ST1 and ST2 have insufficient available charge, due to a low supply voltage perhaps coupled with alpha particle penetration, then the bit line buses will not be charged to proper levels during the READ operation and soft errors will result. It is found, therefore, that very low power supply SRAM cells can exhibit unacceptable soft error rate values.

Several prior art inventions relate to SRAM structures. U.S. Pat. No. 5,547,892 to Wuu et al describes a SRAM with a 6 transistor structure. U.S. Pat. No. 6,140,684 to Chan et al and U.S. Pat. No. 6,271,063 to Chan et al disclose a 6T SRAM formed using two thin-film transistors, two bulk transistors, and two pass transistors. U.S. Pat. No. 5,496,756 to Sharma et al teaches a nonvolatile cell comprising a 6T SRAM structure and a 3T nonvolatile structure.

SUMMARY OF THE INVENTION

A principal object of the present invention is to provide an effective and very manufacturable method to form a SRAM cell and to provide an effective and very manufacturable SRAM cell device.

A further object of the present invention is to provide a method to reduce the soft error rate of a SRAM cell by adding capacitors to the storage nodes of the cell.

A yet further object of the present invention is to provide a method to add capacitors without impact on cell size.

A yet further object of the present invention is to provide a method to add capacitors that is compatible with the current SRAM fabrication technique.

A further object of the present invention is to provide a SRAM cell device with storage capacitors to reduce the soft error rate.

A yet further object of the present invention is to provide a device where the additional capacitors do not add to the cell area.

In accordance with the objects of this invention, a method to form a SRAM memory cell in an integrated circuit device is achieved. The method comprises providing a bi-stable flip-flop cell having a data storage node and a data bar storage node. A first capacitor is formed coupled to the data bar storage node, and a second capacitor is formed coupled to the data storage node. The first and second capacitors each comprise a first conductor layer overlying a second conductor layer with a dielectric layer therebetween. One of the first and second conductor layers is coupled to ground.

Also in accordance with the objects of this invention, a SRAM memory cell in an integrated circuit device is achieved. A bi-stable flip-flop cell has a data storage node and a data bar storage node. A first capacitor is coupled to the data bar storage node, and a second capacitor is coupled to the data storage node. The first and second capacitors each comprise a first conductor layer overlying a second conductor layer with a dielectric layer therebetween. One of the first and second conductor layers is coupled to ground.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a new method to form a SRAM cell device and disclose a new SRAM cell device. Capacitors are added to the storage nodes of a bi-stable flip-flop to reduce soft error rate. It should be clear to those experienced in the art that the present invention can be applied and extended without deviating from the scope of the present invention.

Figure 1:
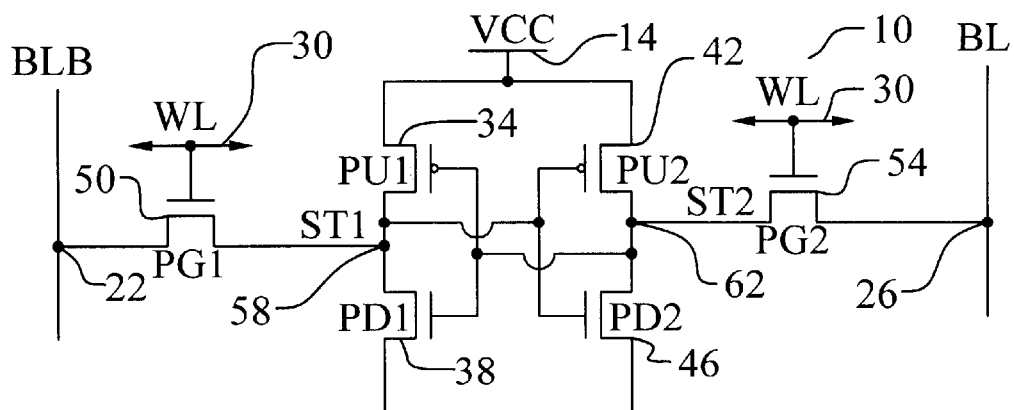
FIG. 1 illustrates a conventional, six transistor SRAM cell.
Figure 2:
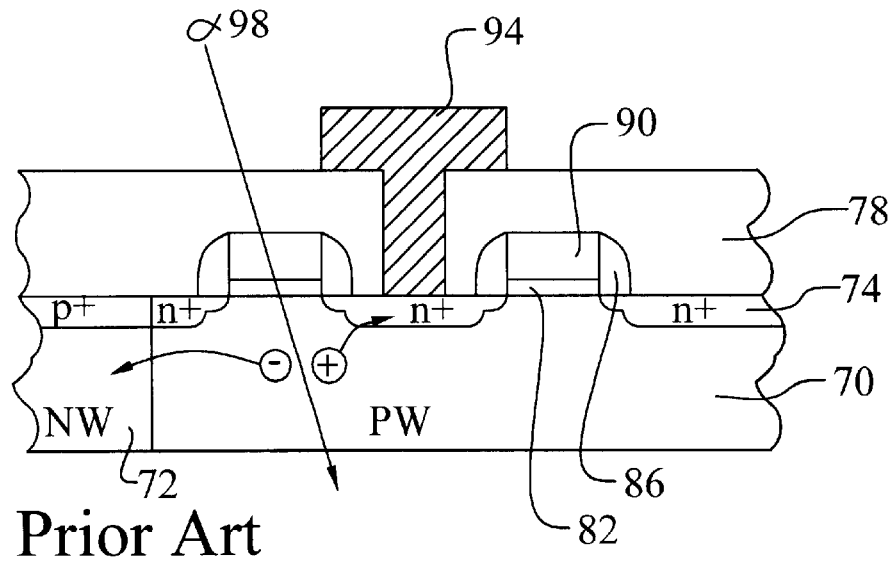
FIG. 2 illustrates a cross section of a part of a SRAM cell showing the effect of alpha particle interaction with the memory cell.
Figure 3:
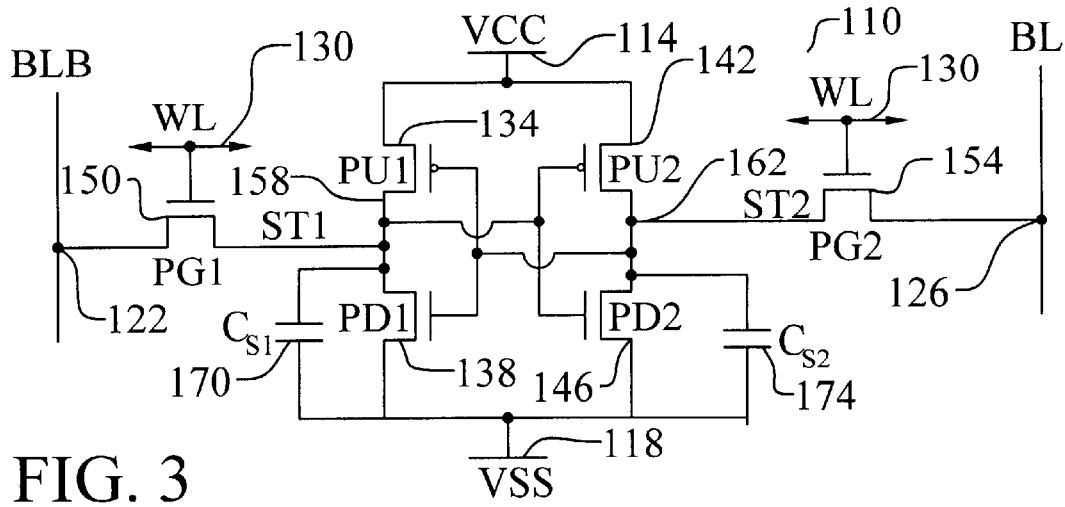
FIG. 3 illustrates a schematic of the first preferred embodiment of the present invention showing a 6T SRAM cell with novel storage capacitors.

Referring now to FIG. 3, the first preferred embodiment of the present invention is illustrated. Several important features of the present invention are shown and discussed below. A schematic of a novel SRAM cell 110 is shown in schematic form. The SRAM cell 110 comprises a bi-stable flip-flop cell having a data storage node ST1 158 and a data bar storage node 162. The bi-stable flip-flop cell preferably comprises a two inverter arrangement where the output of each inverter is coupled to the input of the other inverter. More specifically, the first inverter comprises a pull-up transistor PU1 134 and a pull-down transistor PD1 138. Similarly, the second inverter comprises a pull-up transistor PU2 142 and a pull-down transistor PD2 146. The pull-up transistors preferably comprise p-channel, or PMOS, transistors, and the pull-down transistors preferably comprise n-channel, or NMOS, transistors.

The bi-stable inverter pair can maintain either of two states. First, ST1 158 could be at a low voltage (VSS), and ST2 162 could be at a high voltage (VCC). The inverters will maintain this state indefinitely in the absence of an external disruption. Second, ST1 158 could be at a high voltage (VCC), and ST2 162 could be at a low voltage (VSS). Again, the bi-stable pair will maintain this state indefinitely in the absence of an external disruption.

Access transistors PG1 150 and PG2 154 gate external access to the bi-stable pair. Both PG1 and PG2 are controlled by the word line WL 130 signal. If WL 130 is low, then both PG1 150 and PG2 154 are OFF. The bi-stable inverter storage nodes are then isolated from the bit line BL 126 and BLB 122 signals and will simply maintain the current state. If WL 130 is high, then both PG1 150 and PG2 154 are ON causing BL 126 to be coupled to ST2 162 and BLB 122 to be coupled to ST1 158. If the WL assertion is due to a READ operation, then the BL and BLB signals are high impedance and the charge on ST1 158 and on ST2 162 are coupled onto the BLB 122 and BL 126 buses, respectively, for sensing. If the WL assertion is due to a WRITE operation, then the BL 126 and BLB 122 signals are low impedance and are driven to opposite states. These states are driven into the bi-stable pair to update the states of ST1 158 and ST2 162.

As a most important feature of the present invention, a first capacitor $C_{S1}$ 170 is coupled between the data bar storage node ST1 158 and VSS 118, and a second capacitor $C_{S2}$ 174 is coupled between the data storage node ST2 162 and VSS 118. The addition of discrete, though integrated, capacitors at the storage nodes of the bi-stable pair represents a significant innovation in the present invention. As will be described below, the storage capacitors $C_{S1}$ 170 and $C_{S2}$ 174 may be integrated into the device fabrication process such that the cell 110 size remains the same.

The addition of the storage capacitors $C_{S1}$ 170 and $C_{S2}$ 174 greatly reduces the soft error rate problem of the prior art. Once again, the available charge on the storage nodes is given by $Q=C \times V$. By increasing the node capacitance by $C_{S1}$ 170 or by $C_{S2}$ 174, the available storage charge is proportionally increased. Therefore, even with a low VCC voltage, a large amount of charge is available for charging the BL 126 or BLB 122 buses during the READ operation. In addition, the stored charge at ST1 158 and ST2 162 is less affected by the alpha particle penetration effect.

Figure 4:
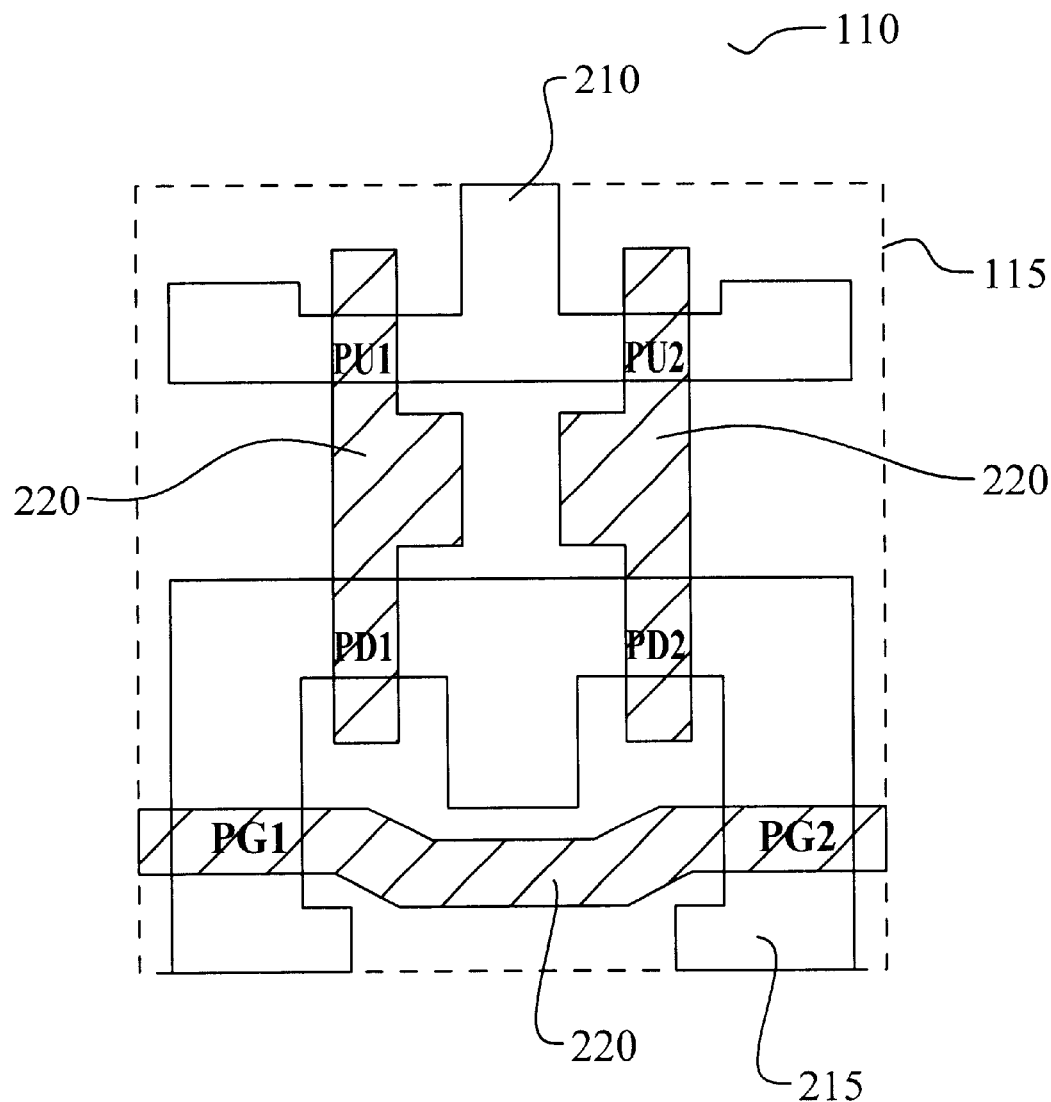
FIGS. 4 through 6 illustrate in layout form the first preferred embodiment of the present invention showing the 6T SRAM cell with novel storage capacitors.

Referring now to FIG. 4, a top layout view of the first embodiment of the present invention is shown. This view depicts the masking layers, in overlay, used in forming the novel SRAM cell 110. In this layout view, only the P+ active area layer 210, the N+ active area layer 215, and the polysilicon layer 220 are shown. Since the cell 110 is typically used in a large array of cells to form a memory block, the cell 110 has a layout boundary 115. The cell 110 can be copied many times into an integrated circuit device by instantiating the cell boundary 115. In the exemplary transistor layout, the six transistors of the SRAM cell are shown. PU1 and PU2 are formed where polysilicon lines 220 cross the P+ active area 210. PD1, PD2, PG1, and PG2 are formed where polysilicon lines 220 cross the N+ active area 215.

Figure 5:
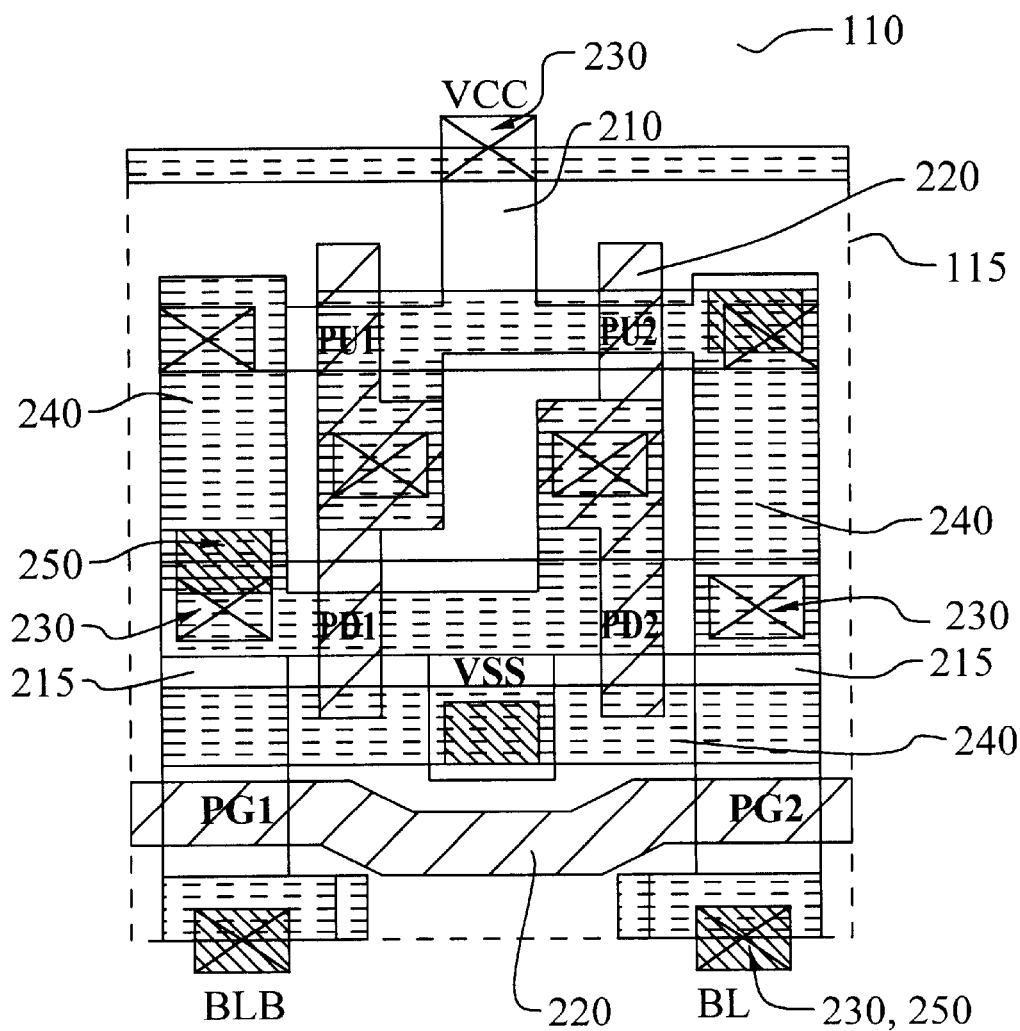

Referring now to FIG. 5, the same cell 110 is shown in layout view. In this drawing, subsequent processing layers are added, including contact (CO) layer 230, metal 1 (M1) layer 240, and via 1 (V1) layer 250. In addition, the P+ active area layer 210, the N+ active area layer 215, and the polysilicon layer 220 are shown for context. As is well known in the art, the polysilicon layer 220 and the active areas 210 and 215 may be contacted by a subsequently formed metal layer using contact openings. Therefore, several CO 230 rectangles are placed on the polysilicon 220 and active areas 210 and 215. M1 lines 240 are placed such that the necessary connectivity of the 6T cell is completed. Additional CO 230 blocks are placed at VCC for external cell routing, at VSS for internal cell routing, and at BL and BLB for external routing. It is also well known in the art to form connectivity between the first metal layer (M1) 240 and subsequent metal layers using via openings. In this case, V1 blocks 250 are placed over the M1 layer to allow connection to a subsequent M2 level, not shown.

Figure 6:
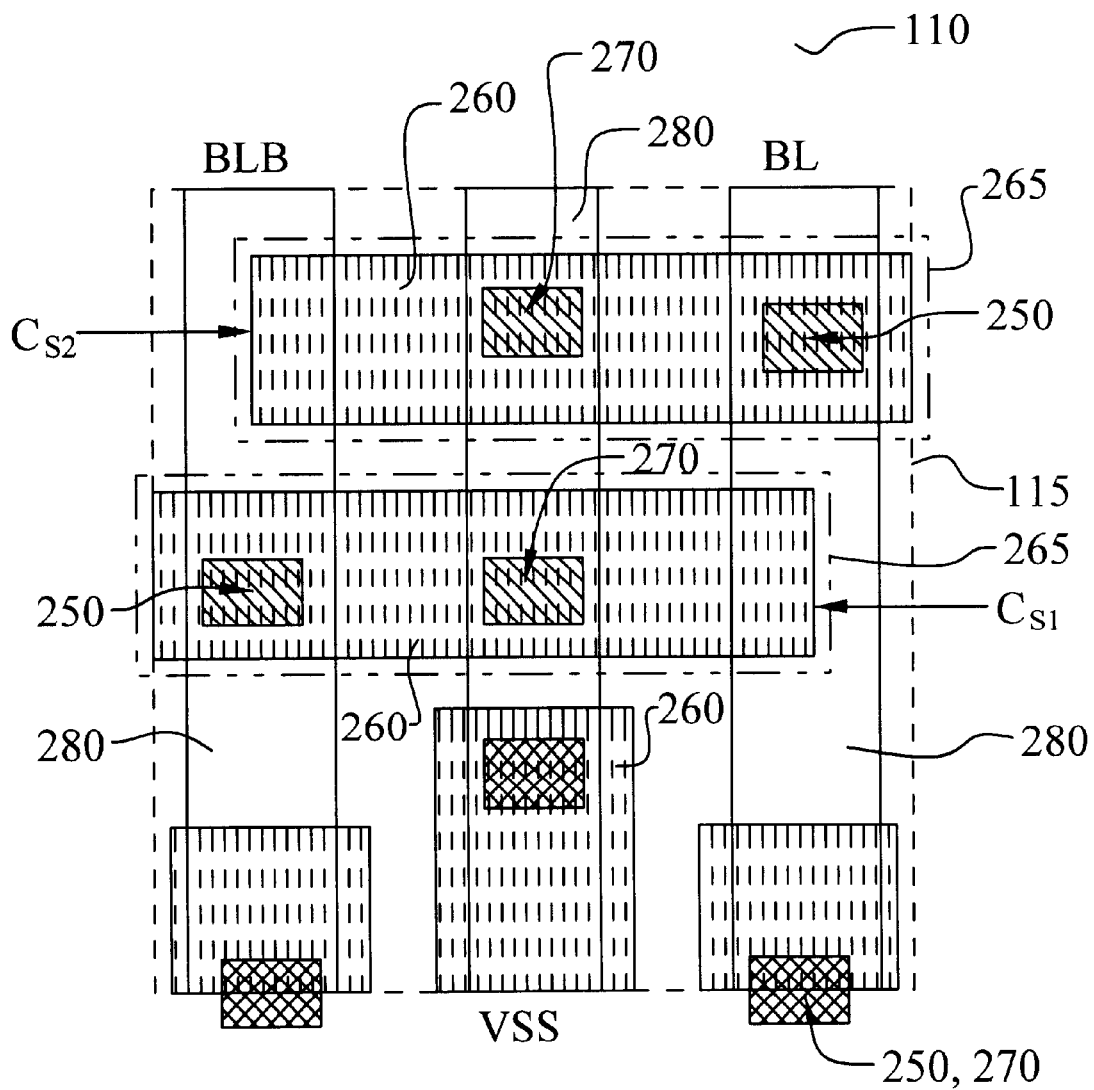

Referring now to FIG. 6, the same cell 110 is again shown in layout view. This view shows the V1 layer 250, a second metal layer (M2) 260, a second via layer (V2) 270, and a third metal layer (M3) 280. Several important features of the present invention are demonstrated. Where the V1 250 blocks are formed in the cell 110, the M2 layer 260 is formed overlying to couple the M1 and M2 layers. V2 blocks 270 are then formed to connect the M2 layer 260 and the M3 layer 280 as is known in the art.

As a special feature of the present invention, polygons are formed in the M2 layer 260 to create the storage capacitors $C_{S1}$ and $C_{S2}$. A novel capacitor layer 265 overlies the M2 layer 260. Several process steps are added to the typical M2-V2-M3 process sequence to create capacitors $C_{S1}$ and $C_{S2}$ without increasing the layout footprint 115 of the cell. These process steps, the use of the capacitor layer 265, and the integration of the storage capacitors are further explained below.

Figure 7:
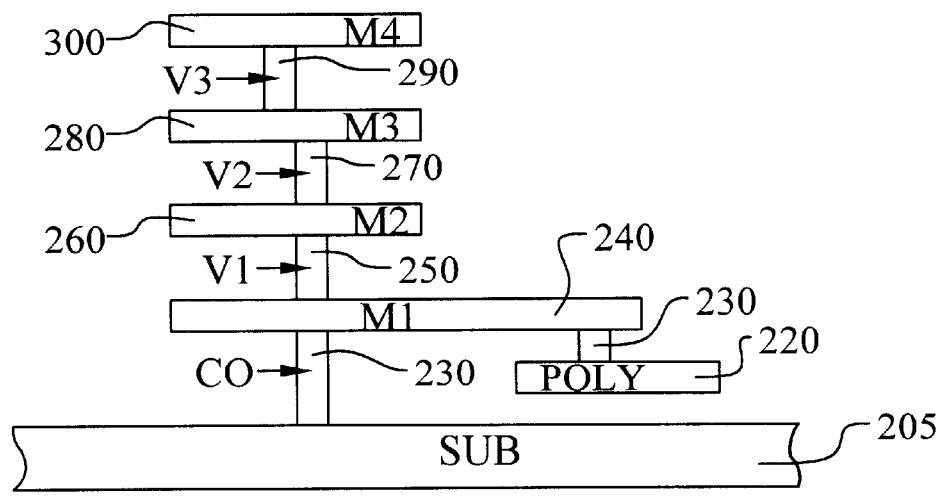
FIG. 7 illustrates a conventional arrangement of connectivity levels in an integrated circuit device.

Referring now to FIG. 7, the structure of connectivity levels in the prior art is shown in cross section. Typically, the substrate 205 and the polysilicon layer 220 may be connected to the M1 layer 240 using contact openings CO 230. M2 layer 260 is connected to M1 layer 240 through V1 layer 250. M3 layer 280 is connected to M2 layer 260 through V2 layer 270. M4 layer 300 is connected to M3 layer 280 through V3 layer 290. This method may be repeated many times until the top-most metal layer is formed.

Figure 8:
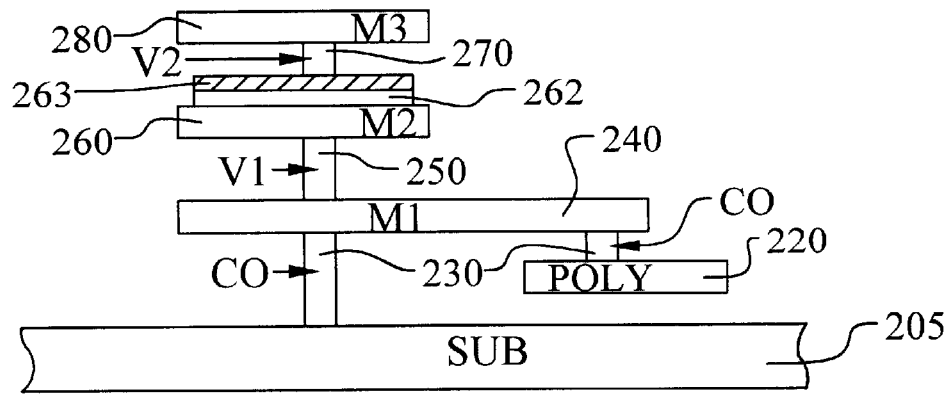
FIG. 8 illustrates in cross section the first preferred embodiment of the present invention.

Referring now to FIG. 8, the novel method of the first embodiment for forming the storage capacitors is shown in cross section. The connectivity of the substrate 205, polysilicon 220, contact 230, M1 240, and V1 250 is the same as in the prior art. In the first preferred embodiment, this means that the 6T SRAM cell 110 can be formed up to the bit line routing prior to the addition of the unique capacitor structures and process.

As important -features, a dielectric layer 262 is deposited overlying the M2 level 260 after the M2 level has been patterned. This dielectric layer 262 may comprise oxide, such as silicon oxide. Alternatively, the dielectric layer may comprise nitride, such as silicon nitride, or a metal oxide, such tantalum oxide. This dielectric layer 262 is deposited comformally over the M2 layer 260. A conductor layer 263 is then deposited overlying the dielectric layer 262. The conductor layer 263 may comprise, for example, copper, aluminum, alloys of copper, or alloys of aluminum. Alternatively, metal nitrides, such as titanium nitride or tantalum nitride, may be used.

After the conductor layer 263 is deposited, the aforementioned capacitor layer 265 is used to define a mask overlying the conductor layer 263. This mask may comprise, for example, a photoresist layer that is deposited, exposed to actinic light through a reticle, and developed. Following development, the conductor layer 263 and the dielectric layer 262 are removed where not covered by the masking layer. As a result, the conductor layer 263 and the dielectric layer 262 remain over the M2 layer 260 where the storage capacitor is desired and is defined in the layout. Following the capacitor definition step, the prior art process is rejoined at the V2 layer 270 step. V2 blocks 270 are formed overlying M2 260. Where the capacitors have been defined, this means that the V2 openings 270-will expose the conductor layer 263. The M3 layer 280 then is connected to the conductor layer 263 through V2 270.

Referring again to FIG. 6, the above-described method is used to form both capacitors $C_{S1}$ and $C_{S2}$. The capacitors are defined by the region of M2 260 that is covered by the capacitor layer 265. Note that $CS_1$ further comprises a V1 connection 250 from the bottom plate M2 260 of the capacitor to an underlying M1 line that is shown in FIG. 5. Referring again to FIG. 5, the underlying M1 line 240 is further coupled to the ST1 node. Therefore, the bottom plate of $C_{S1}$ is coupled to ST1 in agreement with the schematic of FIG. 3. Referring again to FIG. 6, capacitor $C_{S1}$ further comprises a V2 block 270. This V2 block 270 connects the top plate, comprising the conductor layer 263, to the M3 line 280 of the cell 110. This M3 line 280 is further coupled to VSS outside the cell. Therefore, the top plate of capacitor $C_{S1}$ is coupled to VSS in agreement with the schematic of FIG. 3. A similar analysis holds for the storage capacitor $C_{S2}$.

Note that the storage capacitors $C_{S1}$ and $C_{S2}$ can be formed using any available routing space in the metal levels above the transistors of the cell. The method of the first embodiment is not limited to the second metal level M2. The capacitor module could be implemented above any of the metal levels. For example, the storage capacitors could be formed in the third or the fourth metal levels. In general, the capacitors are formed, in this embodiment, as a second conductor layer (such as the conductor layer 263) overlying a first conductor layer (such as M2 260) with a dielectric layer (such as the dielectric layer 262) therebetween. The first conductor layer (M2 260) is then further described as a standard metal routing layer for the cell.

Figure 9:
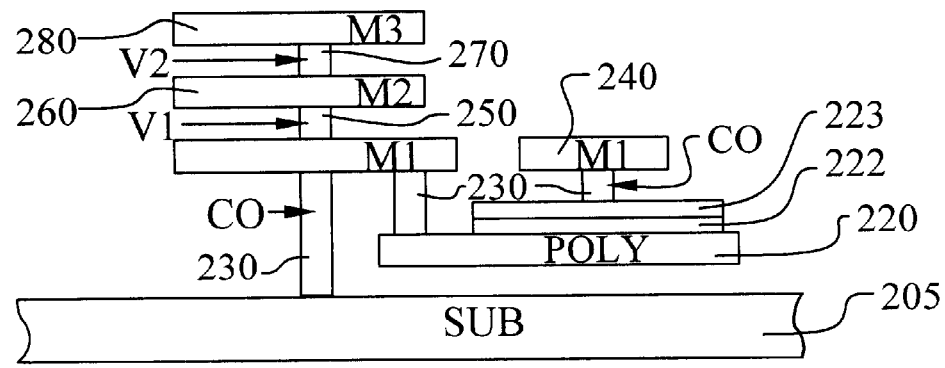
FIG. 9 illustrates in cross section a second preferred embodiment of the present invention.

Referring now to FIG. 9, a second preferred embodiment of the present invention is shown. In this embodiment, the concept is further extended to include forming the storage capacitors in a polysilicon layer 220. Frequently in the art, the integrated circuit manufacturing process will include multiple polysilicon layers for the formation of MOS devices, capacitors, nonvolatile devices, and the like. In that case, the novel method and structure could be applied to any available polysilicon layer. For simplicity, the cross section of FIG. 9 applies the idea to a lone polysilicon layer 220 of a SRAM process.

Following the patterning of the polysilicon layer 220, a dielectric layer 222 is formed overlying the polysilicon layer 222. As in the first embodiment, the dielectric layer 222 may comprise an oxide, such as silicon oxide, a nitride, such as silicon nitride, or a metal oxide, such as tantalum oxide. Further, since the dielectric is formed overlying a silicon layer 220, a silicon oxide layer 222 could be formed by either deposition or by thermal oxidation. Next, a conductor layer 223 is deposited overlying the dielectric layer 222. This conductor layer 223 may again comprise copper, aluminum, an alloy of copper, an alloy of aluminum, or a metal nitride. Alternatively, the conductor layer 223 may comprise another polysilicon layer.

The conductor layer 223 and the dielectric layer 222 are then patterned using the same technique as described in the first embodiment. The conductor layer 223 and the dielectric layer 220 are removed where not covered by a developed capacitor mask. The resulting storage capacitors have a bottom plate comprising the polysilicon layer 220 and a top plate comprising the conductor layer 223. Further connectivity to the polysilicon layer 220 or to the conductive layer 223 is achieved through the contact opening layer 230. This allows a first plate of each storage capacitor to be coupled to the storage node and a second plate to be coupled to VSS. If an SRAM layout includes additional room for polysilicon capacitors, or has no room for metal capacitors, then the second embodiment may be a viable alternative to the first embodiment.

The advantages of the present invention may now be summarized. An effective and very manufacturable method to form a SRAM cell and an effective and very manufacturable SRAM cell device are achieved. A method to reduce the soft error rate of a SRAM cell by adding capacitors to the storage nodes of the cell is achieved. Storage node capacitors are added with no impact on cell size. The method to add capacitors is compatible with the current SRAM fabrication technique. The SRAM cell device includes storage capacitors to reduce the soft error rate. The device provides additional capacitors without adding to the cell area.

As shown in the preferred embodiments, the novel method and device of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form a SRAM memory cell in an integrated circuit device comprising:
   providing a bi-stable flip-flop cell having a data storage node and a data bar storage node; and
   forming a first capacitor coupled to said data bar storage node and a second capacitor coupled to said data storage node wherein said first and second capacitors comprise a first conductor layer overlying a second conductor layer with a dielectric layer therebetween and wherein one of said first and second conductor layers is coupled to ground.

2. The method according to claim 1 wherein said bi-stable flip-flop cell comprises two pull-up transistors, two pull-down transistors, and two pass transistors.

3. The method according to claim 1 wherein said first and second conductor layers comprise polysilicon.

4. The method according to claim 1 wherein said first and second conductor layers comprise metal and wherein one of said first and second metal layers comprises a standard metal level in said integrated circuit device.

5. The method according to claim 1 wherein one of said first and second conductor layers comprises metal nitride.

6. The method according to claim 1 wherein said dielectric layer comprises nitride.

7. The method according to claim 1 wherein said dielectric layer comprises metal oxide.

8. The method according to claim 1 wherein said first and second capacitors are formed by a method comprising:
   depositing said dielectric layer overlying said first conductor layer;
   depositing said second conductor layer overlying said dielectric layer;
   defining a capacitor mask overlying said second conductor layer in planned capacitor areas; and
   removing said second conductor layer and said dielectric layer from all areas not covered by said capacitor mask.

9. A method to form a SRAM memory cell in an integrated circuit device comprising:
   providing a bi-stable flip-flop cell having a data storage node and a data bar storage node; and
   forming a first capacitor coupled to said data bar storage node and a second capacitor coupled to said data storage node wherein said first and second capacitors comprise a first metal layer overlying a second metal layer with a dielectric layer therebetween, wherein one of said first and second metal layers is coupled to ground, and wherein said first and second capacitors are formed by a method comprising:
   depositing said dielectric layer overlying said first metal layer;
   depositing said second metal layer overlying said dielectric layer;
   defining a capacitor mask overlying planned capacitor areas; and
   removing said second metal layer and said dielectric layer from all areas not covered by said capacitor mask.

10. The method according to claim 9 wherein said bi-stable flip-flop cell comprises two pull-up transistors, two pull-down transistors, and two pass transistors.

11. The method according to claim 9 wherein said first metal layer comprises a standard metal level in said integrated circuit device.

12. The method according to claim 9 wherein said dielectric layer comprises nitride.

13. The method according to claim 9 wherein said dielectric layer comprises a metal oxide.

* * * * *